US012606912B2

(12) United States Patent
Li et al.

(10) Patent No.: US 12,606,912 B2
(45) Date of Patent: Apr. 21, 2026

(54) HIGH HEAT LOSS HEATER AND ELECTROSTATIC CHUCK FOR SEMICONDUCTOR PROCESSING

(71) Applicant: Applied Materials, Inc., Santa Clara, CA (US)

(72) Inventors: Jian Li, Fremont, CA (US); Juan Carlos Rocha-Alvarez, San Carlos, CA (US); Mayur Govind Kulkarni, Bangalore (IN); Paul L. Brillhart, Pleasanton, CA (US); Vidyadharan Srinivasamurthy, Bengaluru (IN); Katherine Woo, Santa Clara, CA (US); Wenhao Zhang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 146 days.

(21) Appl. No.: 17/079,155

(22) Filed: Oct. 23, 2020

(65) Prior Publication Data

US 2022/0127723 A1 Apr. 28, 2022

(51) Int. Cl.
*C23C 16/458* (2006.01)
*H01J 37/32* (2006.01)

(52) U.S. Cl.
CPC .... *C23C 16/4586* (2013.01); *H01J 37/32495* (2013.01); *H01J 37/32568* (2013.01); *H01J 37/32724* (2013.01)

(58) Field of Classification Search
CPC ....... C23C 16/04; C23C 16/46; C23C 16/463; C23C 16/4581; C23C 16/4586;

(Continued)

(56) References Cited

U.S. PATENT DOCUMENTS 5,591,269 A * 1/1997 Arami ................... C23C 16/463
118/500
5,968,379 A * 10/1999 Zhao ................... C23C 16/4586
219/121.52

(Continued)

FOREIGN PATENT DOCUMENTS

CN 1759473 A 4/2006
JP 2002217180 A 8/2002

(Continued)

OTHER PUBLICATIONS

International Search Report and Written Opinion mailed Feb. 16, 2022 in International Patent Application No. PCT/US2021/055727, 8 pages.

(Continued)

*Primary Examiner* — Gordon Baldwin
*Assistant Examiner* — Joshua Reyes
(74) *Attorney, Agent, or Firm* — Kilpatrick Townsend & Stockton LLP

(57) ABSTRACT

Exemplary substrate support assemblies may include an electrostatic chuck body defining a support surface that defines a substrate seat. The substrate support surface may include a dielectric coating. The substrate support assemblies may include a support stem coupled with the electrostatic chuck body. The substrate support assemblies may include a cooling hub positioned below a base of the support stem and coupled with a cooling fluid source. The electrostatic chuck body may define at least one cooling channel that is in communication with a cooling fluid source. The substrate support assemblies may include a heater embedded within the electrostatic chuck body. The substrate support assemblies may include an AC power rod extending through the support stem and electrically coupled with the heater. The substrate support assemblies may include a plurality of (Continued)

voids formed within the electrostatic chuck body between the at least one cooling channel and the heater.

17 Claims, 9 Drawing Sheets

(58) Field of Classification Search
CPC ............. C23C 16/5096; H01L 21/6831; H01L 21/6833; H01L 21/68714; H01J 37/32091; H01J 37/32183; H01J 37/32477; H01J 37/32559; H01J 37/32568; H01J 37/32642; H01J 37/32651; H01J 37/32697; H01J 37/32715; H01J 37/32724; H01J 37/32495
See application file for complete search history.

(56) References Cited

U.S. PATENT DOCUMENTS

| | | | |
|---|---|---|---|
| 6,066,836 A | | 5/2000 | Chen et al. |
| 6,159,299 A | * | 12/2000 | Koai ................. H01L 21/67017 |
| | | | 118/728 |
| 10,147,610 B1 | * | 12/2018 | Lingampalli ..... C23C 16/45565 |
| 2005/0229849 A1 | * | 10/2005 | Silvetti ............... C23C 16/4404 |
| | | | 118/725 |
| 2006/0005930 A1 | | 1/2006 | Ikeda et al. |
| 2007/0258186 A1 | * | 11/2007 | Matyushkin ........ H01L 21/6875 |
| | | | 361/234 |
| 2009/0095731 A1 | * | 4/2009 | Asakura ................... C23C 16/46 |
| | | | 219/438 |
| 2009/0200269 A1 | * | 8/2009 | Kadkhodayan ... H01J 37/32091 |
| | | | 427/523 |
| 2009/0277389 A1 | * | 11/2009 | Kakimoto ........... C23C 16/4404 |
| | | | 118/725 |
| 2010/0083902 A1 | * | 4/2010 | Kim ................... H01L 21/67069 |
| | | | 118/723 R |
| 2010/0244350 A1 | | 9/2010 | Fujisato et al. |
| 2010/0323313 A1 | * | 12/2010 | Toriya ................. C23C 16/4586 |
| | | | 432/200 |
| 2011/0065279 A1 | | 3/2011 | Buchberger et al. |
| 2015/0232983 A1 | * | 8/2015 | West ........................ H01L 23/34 |
| | | | 165/104.34 |
| 2015/0376780 A1 | * | 12/2015 | Khaja ............... H01L 21/67103 |
| | | | 134/1.1 |
| 2016/0002779 A1 | * | 1/2016 | Lin .................... H01J 37/32724 |
| | | | 118/500 |
| 2018/0155838 A1 | * | 6/2018 | Rasheed ........... H01L 21/68742 |
| 2019/0067006 A1 | * | 2/2019 | Hawrylchak ..... H01L 21/68785 |
| 2019/0103301 A1 | * | 4/2019 | Tashiro ............. H01L 21/68792 |
| 2019/0203350 A1 | | 7/2019 | Khaja et al. |
| 2019/0272982 A1 | * | 9/2019 | Hawrylchak ..... H01L 21/67069 |

FOREIGN PATENT DOCUMENTS

| | | | |
|---|---|---|---|
| JP | 2004-342984 | A | 12/2004 |
| JP | 2006245563 | A | 9/2006 |
| JP | 2008509553 | A | 3/2008 |
| JP | 2008251681 | A | 10/2008 |
| JP | 2011192661 | A | 9/2011 |
| JP | 2016503962 | A | 2/2016 |
| JP | 2016-072477 | A | 5/2016 |
| JP | 2017120841 | A | 7/2017 |
| JP | 2017519373 | A | 7/2017 |
| JP | 2017538278 | A | 12/2017 |
| JP | 2018113452 | A | 7/2018 |
| JP | 2019504481 | A | 2/2019 |
| JP | 2019140211 | A | 8/2019 |
| TW | 200419693 | A | 10/2004 |
| TW | M263619 | U | 5/2005 |
| TW | 200605260 | A | 2/2006 |
| TW | 200638508 | A | 11/2006 |
| TW | 200910514 | A | 3/2009 |
| TW | 201126600 | A | 8/2011 |
| TW | 201608047 | A | 3/2016 |
| TW | 201937591 | A | 9/2019 |
| TW | 202034447 | A | 9/2020 |

OTHER PUBLICATIONS

"Linear Thermal Expansion Coefficient for Metals", Available online at: https://amesweb.info/Materials/Linear-Thermal-Expansion-Coefficient-Metals.aspx, 2023, pp. 1-4.

Application No. PCT/US2021/055727 , International Preliminary Report on Patentability, Mailed on May 4, 2023, 7 pages.

Office Action for Taiwan Appln 110139191 dated Jun. 27, 2022, 9 pages.

Office Action for Taiwan Appln 110139191 dated Mar. 14, 2024, 17 pages.

Hub: Information and Definition, Apr. 9, 2024, retrieved from https://dictionary.cambridge.org/zht 7 pages.

Notice of Reasons for Rejection for Japan Appln No. 2023524778 dated Jul. 9, 2024, 8 pages.

Notice of Decision to Grant for Taiwan Appln No. 110139191 Jul. 10, 2024, 4 pages.

JP2023-524778, "Office Action", Feb. 4, 2025, 6 pages.

KR10-2023-7017119, "Office Action", Jan. 26, 2025, 4 pages.

Japanese Application No. 2023-524778, Notice of Decision to Grant mailed on Jul. 15, 2025, 3 pages.

Korean Application No. 10-2023-7017119, Notice of Decision to Grant mailed on Sep. 28, 2025, 4 pages (1 page of English Translation and 3 pages of original documents).

* cited by examiner

400

436    435    439    427    430

450b    450a    425

455    440

405

437

460

465    475    445

470

HIGH HEAT LOSS HEATER AND ELECTROSTATIC CHUCK FOR SEMICONDUCTOR PROCESSING

TECHNICAL FIELD

The present technology relates to components and apparatuses for semiconductor manufacturing. More specifically, the present technology relates to substrate support assemblies and other semiconductor processing equipment.

BACKGROUND

Integrated circuits are made possible by processes which produce intricately patterned material layers on substrate surfaces. Producing patterned material on a substrate requires controlled methods for forming and removing material. The temperature at which these processes occur may directly impact the final product. Substrate temperatures are often controlled and maintained with the assembly supporting the substrate during processing. Internally located heating devices may generate heat within the support, and the heat may be transferred conductively to the substrate. The substrate support may also be utilized in some technologies to develop a substrate-level plasma, as well as to chuck the substrate to the support electrostatically. Plasma generated near the substrate may cause bombardment of components, as well as parasitic plasma formation in unfavorable regions of the chamber. The conditions may also lead to discharge between substrate support electrodes. Additionally, utilizing the pedestal for both heat generation and plasma generation may cause interference effects.

As a variety of operational processes may utilize increased temperature as well as substrate-level plasma formation, constituent materials of the substrate support may be exposed to temperatures that affect the electrical operations of the assembly. Thus, there is a need for improved systems and methods that can be used to produce high quality devices and structures. These and other needs are addressed by the present technology.

SUMMARY

Exemplary substrate support assemblies may include an electrostatic chuck body defining a support surface that also defines a substrate seat. The substrate support surface may include a dielectric coating. The substrate support assemblies may include a support stem coupled with the electrostatic chuck body. The substrate support assemblies may include a cooling hub positioned below a base of the support stem and coupled with a cooling fluid source. The electrostatic chuck body may define at least one cooling channel that is in communication with a cooling fluid source. The substrate support assemblies may include a heater embedded within the electrostatic chuck body. The substrate support assemblies may include an AC power rod extending through the support stem and electrically coupled with the heater. The substrate support assemblies may include a plurality of voids formed within the electrostatic chuck body between the at least one cooling channel and the heater.

In some embodiments, the substrate support assemblies may include an RF rod extending through the support stem and electrically coupled with the electrostatic chuck body. The dielectric coating may cover an entire outer surface of the electrostatic chuck body. The substrate support assemblies may include an insulator disposed between the electrostatic chuck body and the support stem. The electrostatic chuck body and the support stem may be formed as a monolithic structure. The substrate support assemblies may include an insulator disposed between the support stem and the cooling hub. A top end of the support stem may include a support bowl that is spaced apart from a bottom surface of the electrostatic chuck body. At least one insulator may be supported atop the support bowl and may be disposed between the support bowl and the electrostatic chuck body. The at least one insulator may include an inner polymeric insulator and an outer ceramic insulator. The substrate support assemblies may include an insulative edge ring seated on a recessed ledge of the electrostatic chuck body. The insulative edge ring may extend radially outward along an exterior edge of the electrostatic chuck body.

Some embodiments of the present technology may also encompass substrate support assemblies that include an electrostatic chuck body defining a substrate support surface that defines a substrate seat. The electrostatic chuck body may include a cooling plate. The electrostatic chuck body may include a support plate positioned atop the cooling plate. The electrostatic chuck body may include a bonding layer disposed between the cooling plate and the support plate. The substrate support assemblies may include a support stem coupled with the electrostatic chuck body. The substrate support assemblies may include an AC heating wire that is electrically coupled with the support plate.

In some embodiments, substrate support assemblies may include a first bipolar electrode embedded within the support plate. The substrate support assemblies may include a second bipolar electrode embedded within the support plate. A minimum diameter of the support stem may be at least or about 10 cm. The cooling plate may define at least one cooling channel that is in communication with a cooling fluid source. The at least one cooling channel may form a circuitous pattern within the cooling plate. A difference between a coefficient of thermal expansion of the support plate and a coefficient of thermal expansion of the cooling plate may be less than or about 10%. The support stem may include an upper portion and a lower portion. A coefficient of thermal expansion of the upper portion may be less than a coefficient of thermal expansion of the lower portion. The substrate support assemblies may include a bonding layer disposed between the cooling plate and the support stem.

Some embodiments of the present technology may also encompass methods of processing a substrate that include heating a top surface of a substrate support assembly. The methods may include flowing a precursor into a processing chamber. The processing chamber may include a substrate support assembly on which a substrate is disposed. The substrate support assembly may include an electrostatic chuck body. The substrate support assembly may include a support stem coupled with the electrostatic chuck body. The substrate support assembly may include an AC heating wire that is electrically coupled with a conductive material within the electrostatic chuck body. The methods may include generating a plasma of the precursor within a processing region of the processing chamber. The methods may include cooling a bottom portion of the substrate support assembly while heating the top surface. The methods may include depositing a material on the substrate. In some embodiments, cooling the bottom portion of the substrate support assembly may include flowing a fluid through one or more cooling channels formed in a portion of the electrostatic chuck body. The methods may include clamping a semiconductor substrate to a support surface of a substrate platform using a chucking voltage.

Such technology may provide numerous benefits over conventional systems and techniques. For example, embodiments of the present technology may provide substrate supports that may provide both heating and chucking capabilities, while reducing thermal shift experienced on wafer. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
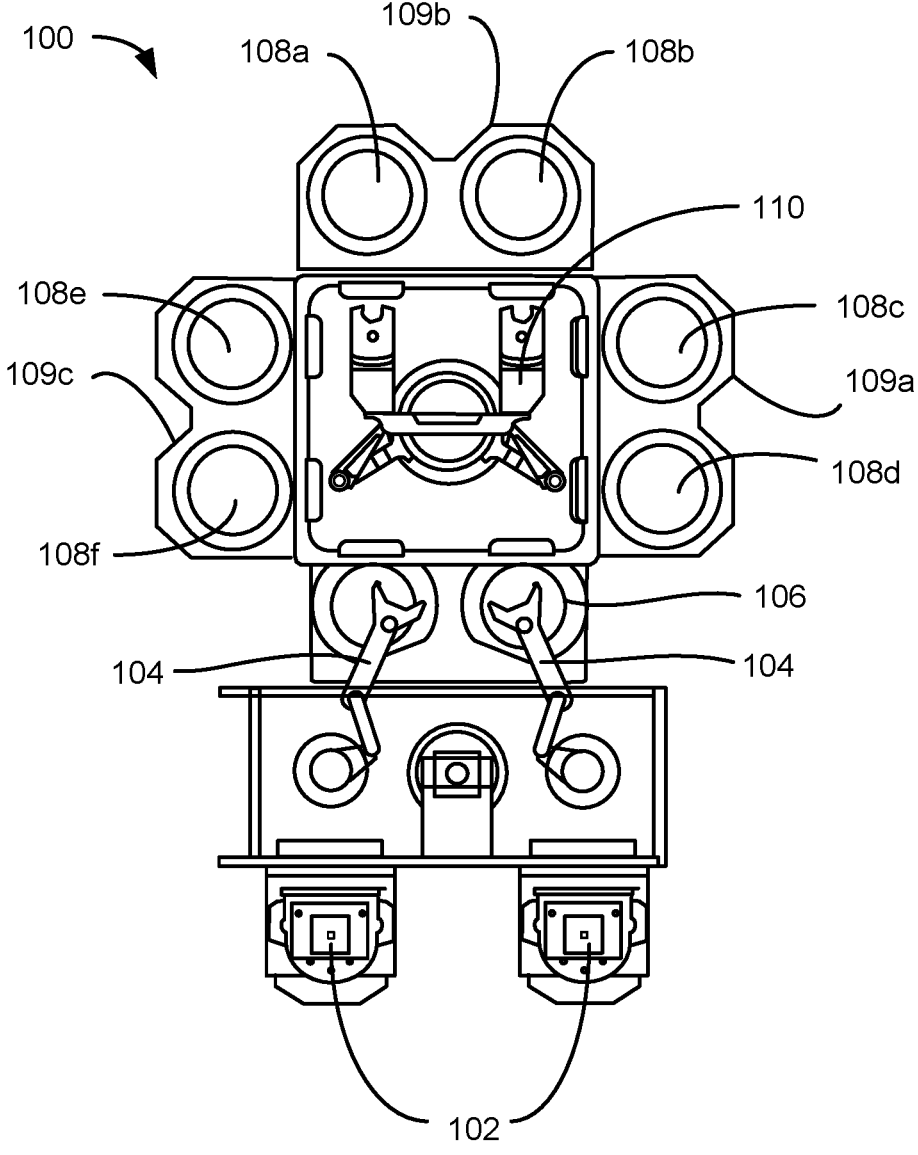
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. Oftentimes, these processes are performed using pedestals that include heaters which may heat and control the substrate temperature at a desired process temperature. The plasma is generated by exothermic reactions, which may generate significant amounts of heat. While many operations may be performed at sufficiently high temperature to overcome a heat effect from the plasma, when operations occur at mid-range temperatures, such as above or about 100° C. but less than or about 500° C., or less, heat from the plasma may impact the process. This heat, along with heat due to ion bombardment during plasma formation, may exceed the amount of heat that may be dissipated by conventional pedestals to maintain a setpoint temperature. As a result, excess heat may build up that causes a thermal shift that leads to the wafer temperature increasing over time. This temperature increase may lead to film non-uniformity on wafer.

The present technology may incorporate substrate support assemblies that may better control temperature drift during treatment operations to increase assurance of a stable and repeatable temperature with each deposition cycle. For example, substrate support assemblies according to some embodiments of the present technology may overcome temperature gradients caused by excess heat generation by incorporating active and/or passive cooling features into the pedestal that help dissipate excess heat, while enabling the pedestal to be actively heated and maintained at a desired temperature by a pedestal heater.

Although the remaining disclosure will routinely identify specific deposition processes utilizing the disclosed technology, it will be readily understood that the systems and methods are equally applicable to other deposition, etching, and cleaning chambers, as well as processes as may occur in the described chambers. Accordingly, the technology should not be considered to be so limited as for use with these specific deposition processes or chambers alone. The disclosure will discuss one possible system and chamber that may include pedestals according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
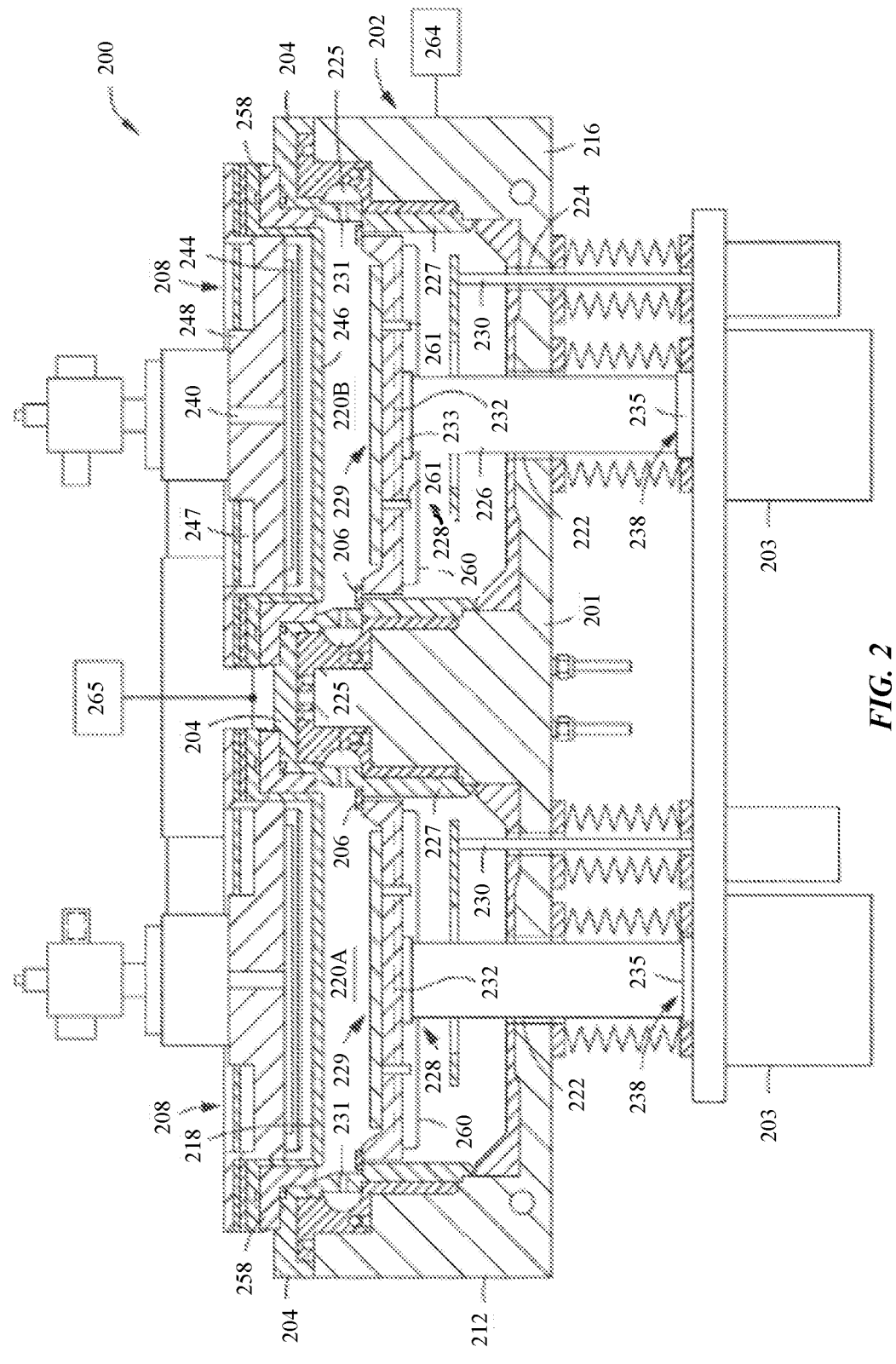
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include substrate support assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the gas distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
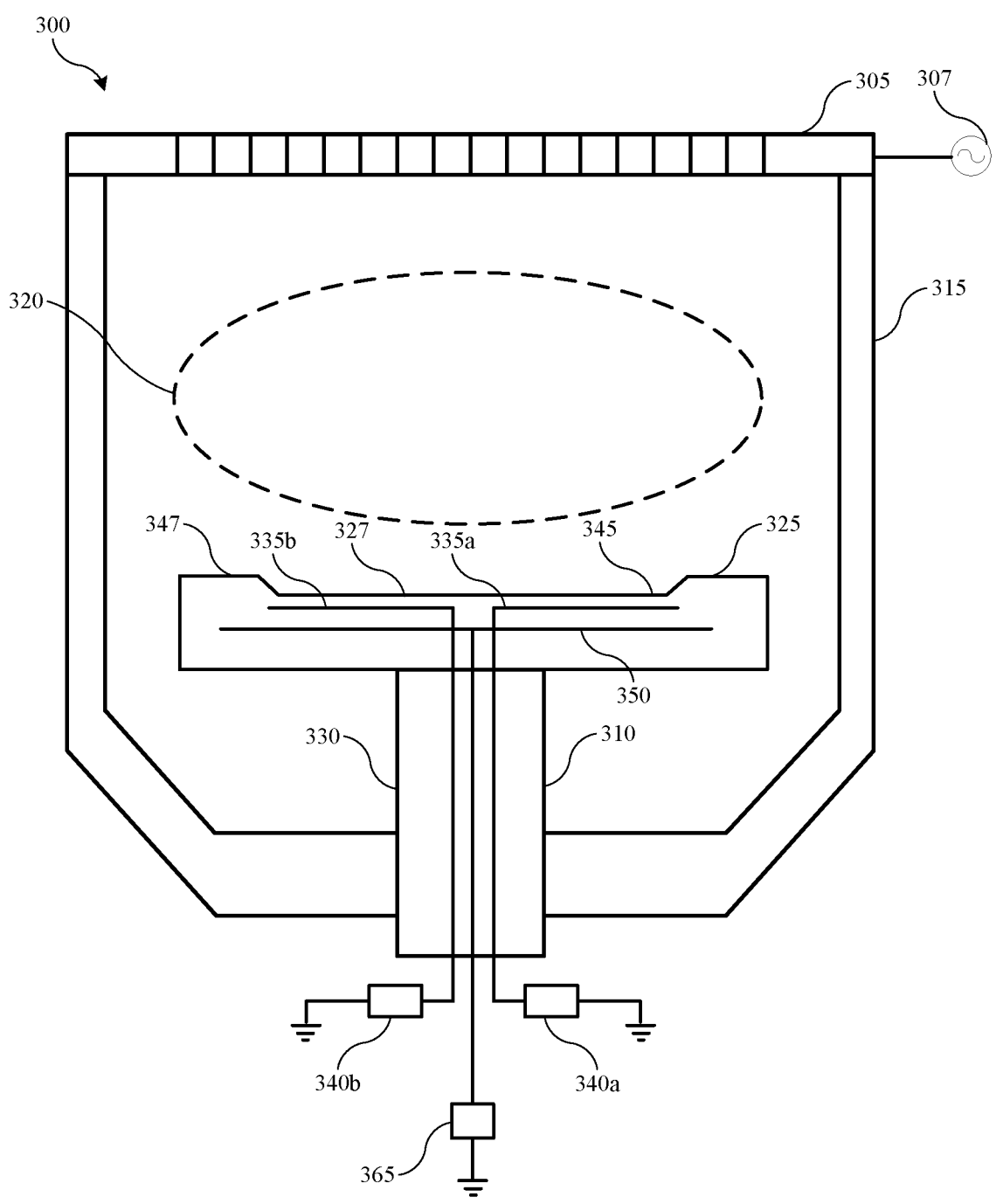
FIG. 3 shows a schematic partial cross-sectional view of an exemplary substrate support assembly according to some embodiments of the present technology.

FIG. 3 shows a schematic partial cross-sectional view of an exemplary semiconductor processing chamber 300 according to some embodiments of the present technology. FIG. 3 may include one or more components discussed above with regard to FIG. 2, and may illustrate further details relating to that chamber. The chamber 300 may be used to perform semiconductor processing operations including deposition of stacks of dielectric materials as previously described. Chamber 300 may show a partial view of a processing region of a semiconductor processing system, and may not include all of the components, such as additional lid stack components previously described, which are understood to be incorporated in some embodiments of chamber 300.

As noted, FIG. 3 may illustrate a portion of a processing chamber 300. The chamber 300 may include a showerhead 305, as well as a substrate support assembly 310. Along with chamber sidewalls 315, the showerhead 305 and the substrate support 310 may define a substrate processing region 320 in which plasma may be generated. The substrate support assembly may include an electrostatic chuck body 325, which may include one or more components embedded or disposed within the body. The components incorporated within the top puck may not be exposed to processing materials in some embodiments, and may be fully retained within the chuck body 325. Electrostatic chuck body 325 may define a substrate support surface 327, and may be characterized by a thickness and length or diameter depending on the specific geometry of the chuck body. In some embodiments the chuck body may be elliptical, and may be characterized by one or more radial dimensions from a central axis through the chuck body. It is to be understood that the top puck may be any geometry, and when radial dimensions are discussed, they may define any length from a central position of the chuck body.

Electrostatic chuck body 325 may be coupled with a stem 330, which may support the chuck body and may include channels for delivering and receiving electrical and/or fluid lines that may couple with internal components of the chuck body 325. Chuck body 325 may include associated channels or components to operate as an electrostatic chuck, although in some embodiments the assembly may operate as or include components for a vacuum chuck, or any other type of chucking system. Stem 330 may be coupled with the chuck body on a second surface of the chuck body opposite the substrate support surface. In some embodiments, the electrostatic chuck body 325 may be formed from a conductive material (such as a metal like aluminum or any other material that may be thermally and or electrically conductive) and may be coupled with a source of electric power (such as DC power, pulsed DC power, RF bias power, a pulsed RF source or bias power, or a combination of these or other power sources) through a filter, which may be an impedance matching circuit to enable the electrostatic chuck body 325 to operate as an electrode. In other embodiments, a top portion of the electrostatic chuck body 325 may be formed from a dielectric material. In such embodiments, the electrostatic chuck body 325 may include separate electrodes. For example, the electrostatic chuck body 325 may include a first bipolar electrode 335a, which may be embedded within the chuck body proximate the substrate support surface. Electrode 335a may be electrically coupled with a DC power source 340a. Power source 340a may be configured to provide energy or voltage to the electrically conductive chuck electrode 335a. This may be operated to form a plasma of a precursor within the processing region 320 of the semiconductor processing chamber 300, although other plasma operations may similarly be sustained. For example, electrode 335a may also be a chucking mesh that operates as electrical ground for a capacitive plasma system including an RF source 307 electrically coupled with showerhead 305. For example, electrode 335a may operate as a ground path for RF power from the RF source 307, while also operating as an electric bias to the substrate to provide electrostatic clamping of the substrate to the substrate support surface. Power source 340a may include a filter, a power supply, and a number of other electrical components configured to provide a chucking voltage.

The electrostatic chuck body may also include a second bipolar electrode 335b, which may also be embedded within the chuck body proximate the substrate support surface. Electrode 335b may be electrically coupled with a DC power source 340b. Power source 340b may be configured to provide energy or voltage to the electrically conductive chuck electrode 335b. Additionally electrical components and details about bipolar chucks according to some embodiments will be described further below, and any of the designs may be implemented with processing chamber 300. For example, additional plasma related power supplies or components may be incorporated.

In operation, a substrate may be in at least partial contact with the substrate support surface of the electrostatic chuck body, which may produce a contact gap, and which may essentially produce a capacitive effect between a surface of the pedestal and the substrate. Voltage may be applied to the contact gap, which may generate an electrostatic force for chucking. The power supplies 340a and 340b may provide electric charge that migrates from the electrode to the substrate support surface where it may accumulate, and which may produce a charge layer having Coulomb attraction with opposite charges at the substrate, and which may electrostatically hold the substrate against the substrate support surface of the chuck body. This charge migration may occur by current flowing through a dielectric material of the chuck body based on a finite resistance within the dielectric for Johnsen-Rahbek type chucking, which may be used in some embodiments of the present technology.

Chuck body 325 may also define a recessed region 345 within the substrate support surface, which may provide a recessed pocket in which a substrate may be disposed. Recessed region 345 may be formed at an interior region of the top puck and may be configured to receive a substrate for processing. Recessed region 345 may encompass a central region of the electrostatic chuck body as illustrated, and may be sized to accommodate any variety of substrate sizes. A substrate may be seated within the recessed region, and contained by an exterior region 347, which may encompass the substrate. In some embodiments the height of exterior region 347 may be such that a substrate is level with or recessed below a surface height of the substrate support surface at exterior region 347. A recessed surface may control edge effects during processing, which may improve uniformity of deposition across the substrate in some embodiments. In some embodiments, an edge ring may be disposed about a periphery of the top puck, and may at least partially define the recess within which a substrate may be seated. In some embodiments, the surface of the chuck body may be substantially planar, and the edge ring may fully define the recess within which the substrate may be seated.

In some embodiments the electrostatic chuck body 325 and/or the stem 330 may be insulative or dielectric materials. For example, oxides, nitrides, carbides, and other materials may be used to form the components. Exemplary materials may include ceramics, including aluminum oxide, aluminum nitride, silicon carbide, tungsten carbide, and any other metal or transition metal oxide, nitride, carbide, boride, or titanate, as well as combinations of these materials and other insulative or dielectric materials. Different grades of ceramic materials may be used to provide composites configured to operate at particular temperature ranges, and thus different ceramic grades of similar materials may be used for the top puck and stem in some embodiments. Dopants may be incorporated in some embodiments to adjust electrical properties as well. Exemplary dopant materials may include yttrium, magnesium, silicon, iron, calcium, chromium, sodium, nickel, copper, zinc, or any number of other elements known to be incorporated within a ceramic or dielectric material.

Electrostatic chuck body 325 may also include an embedded heater 350 contained within the chuck body. Heater 350 may include a resistive heater or a fluid heater in embodiments. In some embodiments the electrode 335 may be operated as the heater, but by decoupling these operations, more individual control may be afforded, and extended heater coverage may be provided while limiting the region for plasma formation. Heater 350 may include a polymer heater bonded or coupled with the chuck body material, although a conductive element may be embedded within the electrostatic chuck body and configured to receive current, such as AC current, to heat the top puck. The current may be delivered through the stem 330 through a similar channel as the DC power discussed above. Heater 350 may be coupled with a power supply 365, which may provide current to a resistive heating element to facilitate heating of the associated chuck body and/or substrate. Heater 350 may include multiple heaters in embodiments, and each heater may be associated with a zone of the chuck body, and thus exemplary chuck bodies may include a similar number or greater number of zones than heaters. If present, the chucking mesh electrodes 335 may be positioned between the heater 350 and the substrate support surface 327 in some embodiments, and a distance may be maintained between the electrode within the chuck body and the substrate support surface in some embodiments as will be described further below.

The heater 350 may be capable of adjusting temperatures across the electrostatic chuck body 325, as well as a substrate residing on the substrate support surface 327. The heater may have a range of operating temperatures to heat the chuck body and/or a substrate above or about 100° C., and the heater may be configured to heat above or about 125° C., above or about 150° C., above or about 175° C., above or about 200° C., above or about 250° C., above or about 300° C., above or about 350° C., above or about 400° C., above or about 450° C., above or about 500° C., above or about 550° C., above or about 600° C., above or about 650° C., above or about 700° C., above or about 750° C., above or about 800° C., above or about 850° C., above or about 900° C., above or about 950° C., above or about 1000° C., or higher. The heater may also be configured to operate in any range encompassed between any two of these stated numbers, or smaller ranges encompassed within any of these ranges, as well as less than any of the stated temperatures. In some embodiments, the chamber 300 may include a purge gas source, such as a purge gas source fluidly coupled with a bottom of the chamber body 315. The purge gas source may supply a purge gas to the chamber 300 to remove any film that has been deposited on various components of the chamber 300, such as the support assembly 310.

Figure 4:
FIG. 4 shows a schematic partial cross-sectional view of an exemplary substrate support assembly according to some embodiments of the present technology.

FIG. 4 shows a schematic partial cross-sectional view of a substrate support assembly 400 according to some embodiments of the present technology. As explained above, the present technology may be used in some embodiments to perform film depositions and cures within a single chamber. Substrate support assembly 400 may be similar to substrate support assembly 310, and may include any feature, component, or characteristic of the support described above, including any associated components or power supplies. Substrate support assembly 400 may include a support stem 405, which may be a conductive material. An electrostatic chuck body 425, which may include one or more components embedded or disposed within the body, may be positioned atop the support stem 405. The components incorporated within the top puck may not be exposed to processing materials in some embodiments, and may be fully retained within the chuck body 425. Electrostatic chuck body 425 may define a substrate support surface 427, and may be characterized by a thickness and length or diameter depending on the specific geometry of the chuck body. In some embodiments the chuck body 425 may be elliptical, and may be characterized by one or more radial dimensions from a central axis through the chuck body. It is to be understood that the top puck may be any geometry, and when radial dimensions are discussed, they may define any length from a central position of the chuck body 425. Disposed between the electrostatic chuck body 425 and the support stem 405 may be an insulator 455. The insulator 455 may be formed from an insulating material, such as, but not limited to, polyether ether ketone (PEEK) or other insulating material that is capable of withstanding high temperatures without deformation or cracking.

In some embodiments, the electrostatic chuck body 425 may be formed from a conductive material, such as aluminum or other metal. Some or all of the electrostatic chuck body 425 may be coated with a dielectric material 430, such as a ceramic or other dielectric material, such as aluminum oxide, or any other oxide, nitride, carbide, or combination material that may limit shorting from the substrate support assembly. This dielectric coating may protect the conductive material during the plasma formation process and may enable the electrostatic chuck body 425, which may be conductive, to operate as an electrostatic chuck, without the need for separate chucking electrodes. The dielectric material may be provided at a thickness of less than or about 1 mm in thickness in some embodiments, and may be maintained less than or about 800 μm in thickness, less than or about 600 μm in thickness, less than or about 500 μm in thickness, less than or about 400 μm in thickness, less than or about 300 μm in thickness, less than or about 200 μm in thickness, or less, although a thickness may be maintained greater than or about 100 μm or greater than or about 200 μm to ensure a complete coverage of the puck surface to limit or prevent shorting. In some embodiments, the dielectric material 430 may be provided only on the substrate support surface 427, while in other embodiments the dielectric material 430 may be provided on other surfaces of the electrostatic chuck body 425. For example, a coating of the dielectric material 430 may be provided on an entire top surface of the electrostatic chuck body 425, lateral surfaces of the electrostatic chuck body 425, bottom surfaces of the electrostatic chuck body 425, and/or all outer surfaces of the electrostatic chuck body 425.

The electrostatic chuck body 425 may include a heater 435, such as an AC heating coil. In some embodiments, the heater 435 may be formed from a conductive wire, such as a wire formed from nickel chromium. An insulating shell 436 may be provided about the heater 435 to prevent shorting. The heater 435 may be formed from one or more heating elements. As just one example, conductive wire may be provided in a radially expanding spiral or other circuitous shape within the electrostatic chuck body 425 to provide relatively uniform heating across the substrate support surface 427. Each heating element of the heater 435 may be coupled with a power source, such as an AC power source that delivers AC current to the heater 435, to heat the top puck. The current may be delivered to the heater 435 through one or more rods or wires 437 that are disposed within channel formed within the stem 405 and the electrostatic chuck body 425. A temperature sensor 439 may extend along the rods or wires 437 in some embodiments. The heater 435 may have a range of operating temperatures to heat the chuck body 425 and/or a substrate above or about 100° C., and the heater 435 may be configured to heat above or about 125° C., above or about 150° C., above or about 175° C., above or about 200° C., above or about 250° C., above or about 300° C., or higher. The heater 435 may also be configured to operate in any range encompassed between any two of these stated numbers, or smaller ranges encompassed within any of these ranges.

A lower portion of the electrostatic chuck body 425 may define one or more cooling channels 440. For example, each cooling channel 440 may be formed in a base of the electrostatic chuck body 425. In some embodiments, a top end of each cooling channel 440 may form an annular or other circuitous pattern about an interior of the electrostatic chuck body 425, which may couple with a cooling fluid source through an inlet and outlet channel through the support stem 405. A cooling fluid, such as water or galden, may be circulated through each cooling channel 440 to cool the lower portion of the electrostatic chuck body 425 to help dissipate excess heat generated during the plasma formation process, which may reduce or eliminate thermal shift and result in more uniform film deposition on the substrate. The cooling fluid may be circulated at a temperature below or about 125° C., below or about 120° C., below or about 115° C., below or about 110° C., below or about 105° C., below or about 100° C., below or about 95° C., below or about 90° C., below or about 85° C., below or about 80° C., below or about 75° C., below or about 70° C., below or about 65° C., below or about 60° C., below or about 55° C., below or about 50° C., or lower. In some embodiments, O-rings 475 may be provided about the inlet and/or outlet channels to help seal the cooling channels 440 at connections between different components. For example, O-rings 475 may be disposed about the inlet and/or outlet channels between the electrostatic chuck body 425 and insulator 455, between the insulator 455 and support stem 405, and/or between the support stem 405 and the cooling hub 445.

The electrostatic chuck body 425 may define a number of voids 450 within an interior of the electrostatic chuck body 425. Voids 450 may act as thermal chokes within the electrostatic chuck body 425 that help distribute heat across the electrostatic chuck body 425. For example, voids 450 may be formed within the electrostatic chuck body 425 between the heater 435 and the top end of the cooling channels 440. In some embodiments, one or more of the voids 450 may be positioned directly above the cooling channels 440. The voids 450 may have any shape. For example, a central void 450a may have a circular or elliptical shape, while outer voids 450b may be annular in shape. In some embodiments, the central void 450a and the outer voids 450b may be concentric with one another. The voids 450 may be at same depth and/or some or all of the voids 450 may be at different depths within the electrostatic chuck body 425. Some voids 450 may have different cross-sectional shapes and/or areas than other voids 450. It will be appreciated that various numbers, sizes, and/or shapes of voids may be provided within the electrostatic chuck body 425 to meet the heat distribution needs of a particular substrate support assembly 400.

Extending through the electrostatic chuck body 425 may be an RF rod 460, which may be coupled with an RF match of a low-frequency power supply 470 to provide a chucking current. RF rod 460 may have a rod insulator 465 extending about the RF rod 460, and that may extend with the RF rod through each of the cooling hub 445, support stem 405, insulator 455, and electrostatic chuck body 425. By having the rod insulator 465 extend along a length of the RF rod 460 and into the hub, an RF leak path to the pedestal shaft may be prevented at the hub. The rod insulator 465 may also shield the RF rod 460 from the current from the AC power source. In some embodiments, in addition to or instead of the rod insulator 464, the RF rod 460 may be spaced apart from the AC rod or wire 437 by a minimum distance, such as by at least or about 2 mm, at least or about 3 mm, at least or about 4 mm, at least or about 5 mm, or more. At an opposite end of the RF rod 460, the RF rod may be coupled with the electrostatic chuck body 425, which may operate as a plasma electrode. In embodiments for which a dielectric coating extends along the puck, the electrostatic chuck body 425 may also operate as a chucking electrode.

Figure 5:
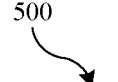
FIG. 5 shows a schematic partial cross-sectional view of an exemplary substrate support assembly according to some embodiments of the present technology.

FIG. 5 shows a schematic partial cross-sectional view of an exemplary substrate support assembly 500 according to some embodiments of the present technology. Substrate support assembly 500 may be similar to substrate support assembly 310 and/or 400, and may include any feature, component, or characteristic of the support described above, including any associated components or power supplies. Substrate support assembly 500 may include a support stem 505 and an electrostatic chuck body 525, which may be formed as a monolithic structure. For example, support stem 505 and electrostatic chuck body 525 may be formed as a single body that may be formed of a conductive material, such as aluminum. The monolithic support stem 505 and electrostatic chuck body 525 may include one or more components embedded or disposed within the body. Electrostatic chuck body 525 may define a substrate support surface 527. Some or all of the monolithic support stem 505 and electrostatic chuck body 525 may be coated with a dielectric material 530. In some embodiments, the dielectric material 530 may be provided only on the substrate support surface 527, while in other embodiments the diametric material 530 may be provided on other surfaces of the support stem 505 and/or electrostatic chuck body 525. For example, a coating of the dielectric material 530 may be provided on an entire top surface of the electrostatic chuck body 525, lateral surfaces of the support stem 505 and/or electrostatic chuck body 525, bottom surfaces of the support stem 505 and/or electrostatic chuck body 525, and/or all outer surfaces of the support stem 505 and/or electrostatic chuck body 525. In some embodiments, the dielectric material 530 may be a plasma-sprayed coating and/or an anodized layer. In a particular embodiment, a top surface and outermost lateral edge of the electrostatic chuck body 525 may include a plasma-sprayed coating of the dielectric material, while inner lateral surfaces and/or bottom surfaces of the electrostatic chuck body 525 and/or support stem 505 may include an anodized layer of the dielectric material 530. In some embodiments, a single surface of the electrostatic chuck body 525 and/or support stem 505 may include both a plasma-sprayed coating and an anodized layer of dielectric material. The dielectric material 530 may be the same or different material across different surfaces of the electrostatic chuck body 525 and/or support stem 505. A thickness of the dielectric material 530 may vary or be constant across one or more surfaces of the electrostatic chuck body 525 and/or support stem 505. Disposed between the support stem 505 and a cooling hub 545 may be an insulator 555. The insulator 555 may be formed from an insulating material, such as, but not limited to, polyether ether ketone (PEEK) or other insulating material that is capable of withstanding high temperatures without deformation or cracking.

The electrostatic chuck body 525 may include a heater 535 having one or more heating elements, such as an AC heating coil. An insulating shell 536 may be provided about the heater 535 to prevent shorting. Each heating element of the heater 535 may be coupled with a power source, such as an AC power source that delivers AC current to the heater 535, to heat the top puck. The current may be delivered to the heater 535 through one or more rods or wires 537 that are disposed within channel formed within the stem 505 and the electrostatic chuck body 525. A temperature sensor 539 may extend along the rod or wire 537 in some embodiments.

By utilizing a monolithic support stem 505 and electrostatic chuck body 525, an interface between the conductive material used to form the electrostatic chuck body 525 (and support stem 505) and the insulating material of the insulator 555 is moved further from the heater 535, which keeps the interface cooler and may make it easier to manage thermal shift as the heating and cooling features may be moved further from the substrate support surface 527.

The support stem 505 and a lower portion of the electrostatic chuck body 525 may define one or more cooling channels 540. Each cooling channel 540 may be coupled with an inlet channel and an outlet channel that extend into the cooling hub 545, where the inlet and outlet channels are fluidly coupled with a cooling fluid source. The cooling fluid source may circulate a cooling fluid through each cooling channel 540 to cool the lower portion of the electrostatic chuck body 525 to help dissipate excess heat generated during the plasma formation process, which may reduce or eliminate thermal shift and result in more uniform film deposition on the substrate. In some embodiments, O-rings 575 may be provided about the inlet and/or outlet channels to help seal the inlet and/or outlet channels at connections between different components. For example, O-rings 575 may be disposed about the inlet and/or outlet channels between the insulator 555 and support stem 505, and/or between the insulator 555 and the cooling hub 545.

The electrostatic chuck body 525 may define a number of voids 550 within an interior of the electrostatic chuck body 525 that may act as thermal chokes within the electrostatic chuck body 525 to help distribute heat across the electrostatic chuck body 525. An RF rod 560 may extend from an RF match of a low-frequency power supply 570 to the conductive material of the monolithic electrostatic chuck body 525 and support stem 505 to provide chucking current to the electrostatic chuck body 525. In some embodiments, the RF rod 560 may include a rod insulator and/or may be spaced apart from the AC rod or wire 537 by a minimum distance to shield the RF rod 560 from the current from the AC power source. As the electrostatic chuck body 525 and support stem 505 are part of a monolithic structure, the RF rod 560 may extend upward to the electrostatic body 525 and/or may extend only into the support stem 505, such as up to a bottom portion of the support stem 505.

Figure 6:
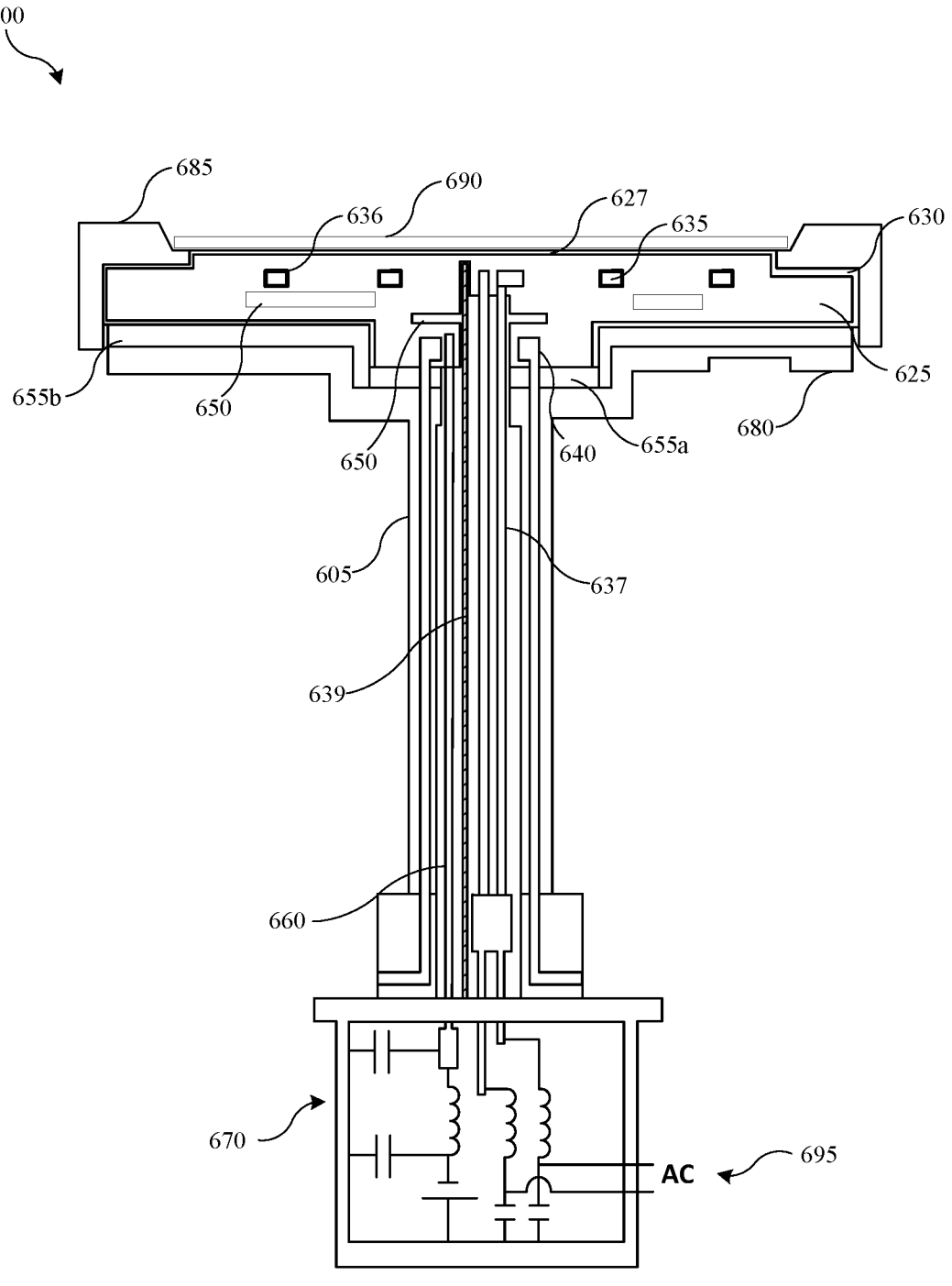
FIG. 6 shows a schematic partial cross-sectional view of an exemplary substrate support assembly according to some embodiments of the present technology.

FIG. 6 shows a schematic partial cross-sectional view of an exemplary substrate support assembly 600 according to some embodiments of the present technology. Substrate support assembly 600 may be similar to substrate support assembly 310, 400, and/or 500, and may include any feature, component, or characteristic of the support described above, including any associated components or power supplies. Support assembly 600 may show a partial view of a substrate support assembly of a semiconductor processing system, and may not include all of the components, and which are understood to be incorporated in some embodiments of support assembly 600. Substrate support assembly 600 may include a support stem 605, which may be a conductive material. An electrostatic chuck body 625, which may include one or more components embedded or disposed within the body, may be positioned atop the support stem 605. Electrostatic chuck body 625 may define a substrate support surface 627. Disposed between the electrostatic chuck body 625 and the support stem 605 may be one or more insulators 655. For example, a top end of the support stem 605 may include a support bowl 680 that is spaced apart from a bottom surface of the electrostatic chuck body 625 and on which the insulators 655 are supported. The support bowl 680 may extend radially outward of a shaft portion of the support stem 605. For example, the support bowl 680 may extend outward such that a peripheral edge of the support bowl 680 is substantially aligned with a peripheral edge of the electrostatic chuck body 625, although the peripheral edge of the support bowl 680 may be inward or outward of the peripheral edge of the electrostatic chuck body 625 in some embodiments. In some embodiments, the insulators 655 include an inner insulator 655a and an outer insulator 655b. The inner insulator 655a may be formed from an insulating material, such as, but not limited to, polyether ether ketone (PEEK) or other insulating material that is capable of withstanding high temperatures without deformation or cracking. The inner insulator 655a may be mechanically fastened, coupled, or otherwise secured to the support bowl 680. The outer insulator 655b may be formed from an insulating material, such as aluminum oxide. To prevent cracking or other damage to the outer insulator 655b, the outer insulator 655b may float or rest atop a surface of the support bowl 680 without any mechanical coupling to secure the outer insulator 655b in place. In some embodiments, only a single insulator 655 or more than two insulators 655 may be used. The insulators 655 together may extend along an entire bottom surface of the electrostatic chuck body 625 in some embodiments.

In some embodiments, an insulative edge ring 685 may be seated on a recessed ledge defined on the puck and extending about an outer edge of the puck. As illustrated, edge ring 685 may extend radially outward along an exterior edge of the electrostatic chuck body 625, and may extend over and contact an outer edge of the electrostatic chuck body 625, in some embodiments. The edge ring 685 may extend over the top edge of the electrostatic chuck body 625 such that an inner edge of the edge ring 685 forms an outer edge of the substrate support surface 627. This allows the entire top surface of the electrostatic chuck body 625 to be covered by a substrate 690 and the edge ring 685 when the substrate 690 is seated on the substrate support surface 627. By covering the top surface of the electrostatic chuck body 625, the top surface of the electrostatic chuck body 625 may be protected from plasma and film deposition that may lead to uniformity problems in future processing operations. By providing the edge ring 685 and the insulators 655, the entire outer surface of the electrostatic chuck body 625 (or a substantial portion thereof) may be protected from plasma formation and film deposition during processing operations.

Some or all of the electrostatic chuck body 625 may be coated with a dielectric material 630. In some embodiments, the dielectric material 630 may be provided only on the substrate support surface 627, while in other embodiments the diametric material 630 may be provided on other surfaces of the electrostatic chuck body 625. For example, a coating of the dielectric material 630 may be provided on an entire top surface of the electrostatic chuck body 625, lateral surfaces of the electrostatic chuck body 625, bottom surfaces of the electrostatic chuck body 625, and/or all outer surfaces of the electrostatic chuck body 625. In a particular embodiment, the coating of the dielectric material may be provided on all exterior surfaces of the electrostatic chuck body 625 except for at the interface between the electrostatic chuck body 625 and the inner insulator 655a.

The electrostatic chuck body 625 may include an embedded heater 635 having one or more heating elements, such as an AC heating coil. An insulating shell 636 may be provided about the heater 535 to prevent shorting. Each heating element of the heater 635 may be coupled with a power source, such as an AC power source 695 that delivers AC current to the heater 635, to heat the top puck. The current may be delivered to the heater 635 through one or more rods or wires 637 that are disposed within channel formed within the stem 605 and the electrostatic chuck body 625. A temperature sensor 639 may extend along the rods or wires 637 in some embodiments.

A lower portion of the electrostatic chuck body 625 may define one or more cooling channels 640. Each cooling channel 640 may be fluidly coupled with a cooling fluid source via an inlet channel and an outlet channel that extend through the support stem 605. The cooling fluid source may circulate a cooling fluid through each cooling channel 640 to cool the lower portion of the electrostatic chuck body 625 to help dissipate excess heat generated during the plasma formation process, which may reduce or eliminate thermal shift and result in more uniform film deposition on the substrate. In some embodiments, O-rings may be provided about the inlet and/or outlet channels to help seal the inlet and/or outlet channels at connections between different components.

The electrostatic chuck body 625 may define a number of voids 650 within an interior of the electrostatic chuck body 625 that may act as thermal chokes within the electrostatic chuck body 625 to help distribute heat across the electrostatic chuck body 625. An RF rod 660 may extend from an RF match of a low-frequency power supply 670 to the conductive material of the electrostatic chuck body 625 to provide chucking current to the electrostatic chuck body 625. In some embodiments, the RF rod 660 may include a rod insulator and/or may be spaced apart from the AC rod or wire 637 by a minimum distance to shield the RF rod 660 from the current from the AC power source.

Figure 7:
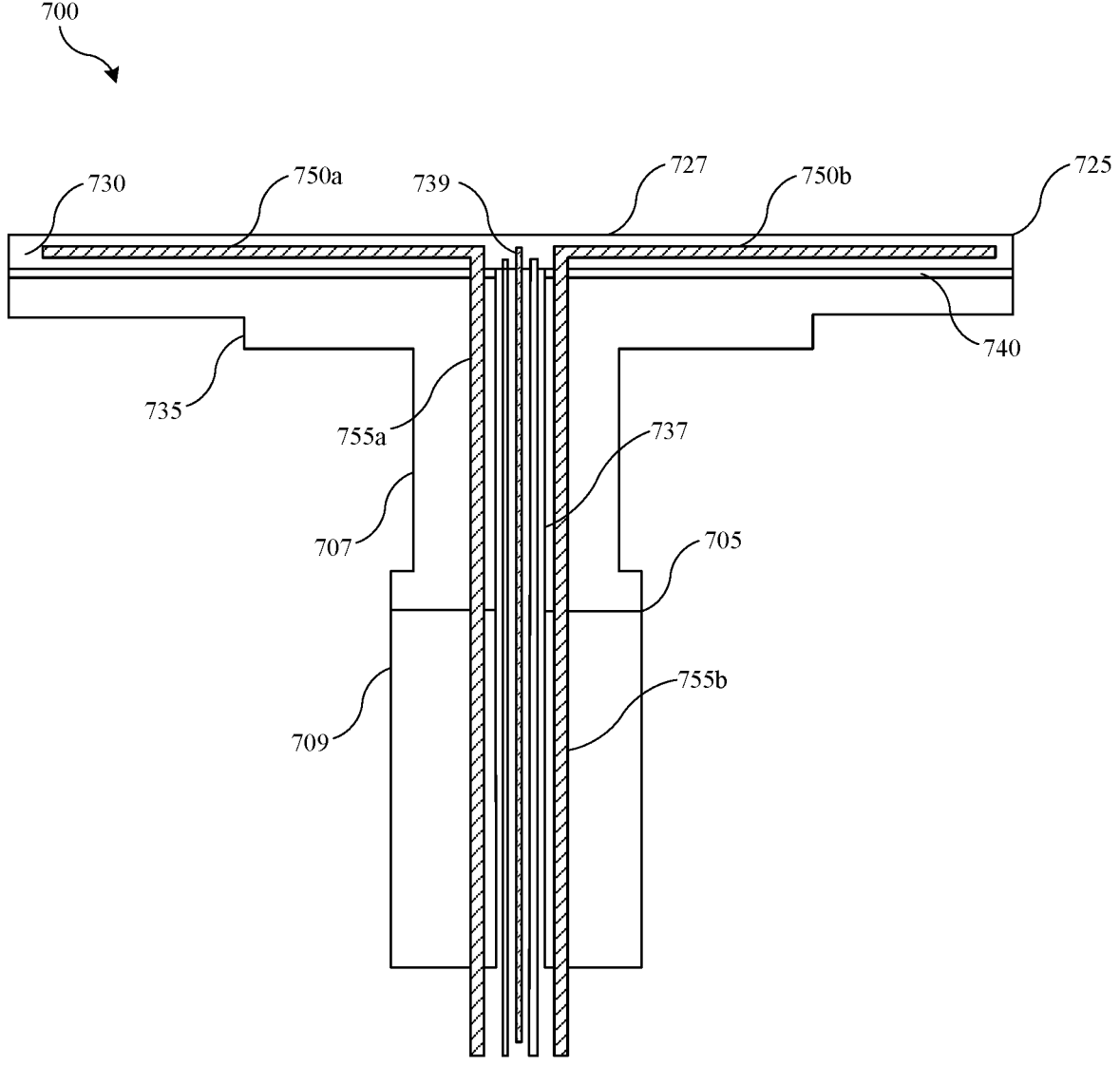
FIG. 7 shows a schematic partial cross-sectional view of an exemplary substrate support assembly according to some embodiments of the present technology.

FIG. 7 shows a schematic partial cross-sectional view of a substrate support assembly 700 according to some embodiments of the present technology. Substrate support assembly 700 may be similar to substrate support assembly 310, 400, 500, and/or 600 and may include any feature, component, or characteristic of the supports described above, including any associated components or power supplies. Support assembly 700 may show a partial view of a substrate support assembly of a semiconductor processing system, and may not include all of the components, and which are understood to be incorporated in some embodiments of support assembly 700. Substrate support assembly 700 may include a support stem 705, which may be formed from one or more conductive materials. An electrostatic chuck body 725, which may include one or more components embedded or disposed within the body, may be positioned atop the support stem 705. The components incorporated within the top puck may not be exposed to processing materials in some embodiments, and may be fully retained within the chuck body 725. Electrostatic chuck body 725 may define a substrate support surface 727, and may be characterized by a thickness and length or diameter depending on the specific geometry of the chuck body. In some embodiments the chuck body 725 may be elliptical, and may be characterized by one or more radial dimensions from a central axis through the chuck body. It is to be understood that the top puck may be any geometry, and when radial dimensions are discussed, they may define any length from a central position of the chuck body 725.

The electrostatic chuck body 725 include a support plate 730 that defines the substrate surface 727. The support plate 730 may be formed from insulative or dielectric materials. For example, oxides, nitrides, carbides, and other materials may be used to form the support plate 730. Exemplary materials may include ceramics, including aluminum oxide, aluminum nitride, silicon carbide, tungsten carbide, and any other metal or transition metal oxide, nitride, carbide, boride, or titanate, as well as combinations of these materials and other insulative or dielectric materials. The electrostatic chuck body 725 may include a cooling plate 735 that is positioned beneath the support plate 730 and that may be coupled with a top end of the support stem 705. The cooling plate 735 may be formed may be formed from a material having a high thermal conductivity. The high thermal conductivity helps dissipate excess heat away from the support plate 730 to reduce thermal shift that may lead to film non-uniformity on the substrate. The material forming the cooling plate 735 may also have a coefficient of thermal expansion that is similar to that of the support plate 730 to prevent damage or deformation of the electrostatic chuck body 725 during temperature fluctuations. For example, a difference between the coefficient of thermal expansion of the support plate 730 and the cooling plate 735 may be less than or about 20%, less than or about 15%, less than or about 10%, less than or about 9%, less than or about 8%, less than or about 7%, less than or about 6%, less than or about 5%, less than or about 4%, less than or about 3%, less than or about 2%, less than or about 1%, or less. In some embodiments, the cooling plate 735 may be formed of a material such as aluminum silicon carbide and/or molybdenum. A bonding layer 740 may be positioned between the support plate 730 and the cooling plate 735. For example, a thin bonding layer 740 of aluminum or other material that is capable of withstanding high temperatures may be used to secure the support plate 730 atop the cooling plate 735. The bonding layer 740 may be less than or about 50 μm thick, less than or about 45 μm thick, less than or about 40 μm thick, less than or about 35 μm thick, less than or about 30 μm thick, less than or about 25 μm thick, less than or about 20 μm thick, less than or about 15 μm thick, less than or about 10 μm thick, less than or about 5 μm thick, less than or about 4 μm thick, less than or about 3 μm thick, less than or about 2 μm thick, less than or about 1 μm thick, or less. Although the material of the bonding layer may be characterized by a coefficient of thermal expansion greater than the other materials, the minor incorporation may limit temperature effects between the components.

The dissipation of excess heat may be further aided by the design of the support stem 705. For example, the support stem 705 may include an upper portion 707 and a lower portion 709 in some embodiments. The upper portion 707 may be formed of a similar high thermal conductivity material as the cooling plate 735, such as aluminum silicon carbide and/or molybdenum. The material of the upper portion 707 may be selected to have a similar coefficient of thermal expansion as the cooling plate 735. The lower portion 709 may be formed of a conductive material, such as aluminum, which may have a greater coefficient of thermal expansion than the material forming the upper portion 707. The high conductivity of both the upper portion 707 and lower portion 709 may help dissipate heat away from the support plate 730 and substrate support surface 727 to reduce thermal shift experienced by a substrate. The support stem 705 may be thicker than conventional support stems to provide greater amounts of conductive material to dissipate greater levels of heat. For example, the support stem 705 may have a minimum thickness of about or at least 10 cm, about or at least 11 cm, about or at least 12 cm, about or at least 12 cm, about or at least 13 cm, about or at least 14 cm, about or at least 15 cm, or more.

The support plate 730 may be coupled with a power source, such as an AC power source that delivers AC current to the support plate 730, to heat the top puck. The current may be delivered to the support plate 730 through one or more rods or wires 737 that are disposed within channel formed within the stem 705 and the electrostatic chuck body 725. A temperature sensor 739 may extend along the rods or wires 737 in some embodiments. The support plate 730 may have a range of operating temperatures to heat the chuck body 725 and/or a substrate above or about 100° C., and the heater may be configured to heat above or about 125° C., above or about 150° C., above or about 175° C., above or about 200° C., above or about 250° C., above or about 300° C., or higher. The heater may also be configured to operate in any range encompassed between any two of these stated numbers, or smaller ranges encompassed within any of these ranges.

The support plate 730 may include chucking electrodes 750. For example, the support plate 730 may include a first bipolar electrode 750a, which may be embedded within the chuck body proximate the substrate support surface 727. Electrode 750a may be electrically coupled with a DC power source using an RF rod 755a that may be configured to provide energy or voltage to the electrically conductive chuck electrode 750a. This may be operated to form a plasma of a precursor within the processing region of a semiconductor processing chamber, although other plasma operations may similarly be sustained. For example, electrode 750a may also be a chucking mesh that operates as electrical ground for a capacitive plasma system including an RF source electrically coupled with a showerhead. For example, electrode 750a may operate as a ground path for RF power from the RF source, while also operating as an electric bias to the substrate to provide electrostatic clamping of the substrate to the substrate support surface 727. The power source may include a filter, a power supply, and a number of other electrical components configured to provide a chucking voltage.

The support plate 730 may also include a second bipolar electrode 750b, which may also be embedded within the chuck body proximate the substrate support surface. Electrode 750b may be electrically coupled with a DC power source using an RF rod 755b. The power source may be configured to provide energy or voltage to the electrically conductive chuck electrode 750b.

Figure 8:
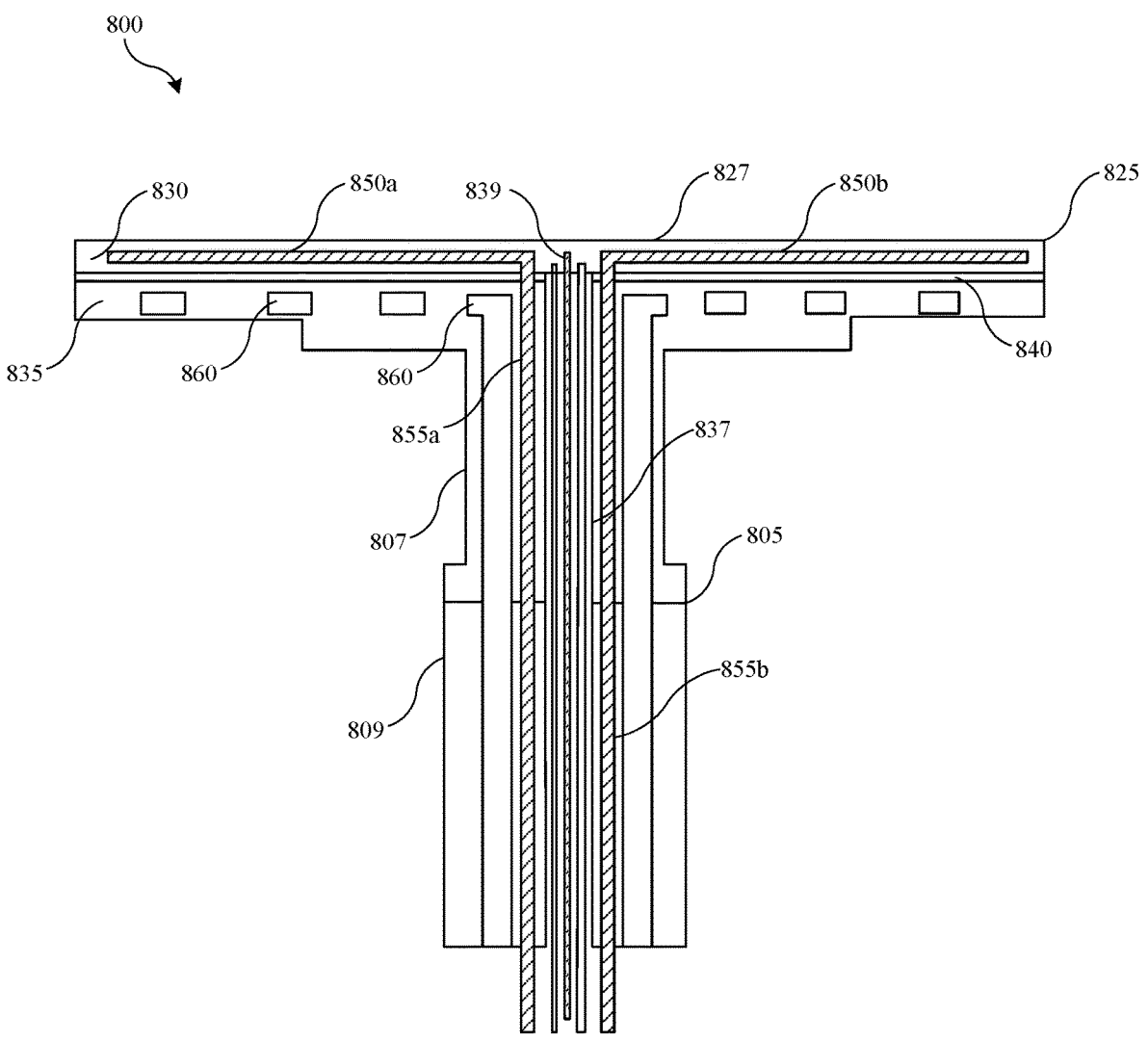
FIG. 8 shows a schematic partial cross-sectional view of an exemplary substrate support assembly according to some embodiments of the present technology.

FIG. 8 shows a schematic partial cross-sectional view of a substrate support assembly 700 according to some embodiments of the present technology. Substrate support assembly 800 may be similar to substrate support assembly 310, 400, 500, 600, and/or 700 and may include any feature, component, or characteristic of the support described above, including any associated components or power supplies. Support assembly 800 may show a partial view of a substrate support assembly of a semiconductor processing system, and may not include all of the components, and which are understood to be incorporated in some embodiments of support assembly 800. Substrate support assembly 800 may include a support stem 805, which may be formed from one or more conductive materials. An electrostatic chuck body 825 may be positioned atop the support stem 805. Electrostatic chuck body 825 may include a support plate 830 that defines a substrate surface 827. The electrostatic chuck body 825 may include a cooling plate 835 that is positioned beneath the support plate 830 and that may be coupled with a top end of the support stem 805 using a bonding layer 840. The support stem 805 may include an upper portion 807 and a lower portion 809 in some embodiments.

The support plate 830 may be coupled with a power source, such as an AC power source that delivers AC current to the support plate 830, to heat the top puck. The current may be delivered to the support plate 830 through one or more rods or wires 837 that are disposed within channel formed within the stem 805 and the electrostatic chuck body 825. A temperature sensor 839 may extend along the rods or wires 837 in some embodiments. The support plate 830 may include chucking electrodes 850. For example, the support plate 830 may include a first bipolar electrode 850a, which may be embedded within the chuck body proximate the substrate support surface 827. Electrode 850a may be electrically coupled with a DC power source using an RF rod 855a that may be configured to provide energy or voltage to the electrically conductive chuck electrode 850a. The support plate 830 may also include a second bipolar electrode 850b, which may also be embedded within the chuck body proximate the substrate support surface. Electrode 850b may be electrically coupled with a DC power source using an RF rod 855b.

The cooling plate 830 and support stem 805 may define one or more cooling channels 860. For example, a top end of each cooling channel 860 may be formed in the cooling plate 860 and may extend through the support stem 805. In some embodiments, each cooling channel 860 may form an annular, spiral or other circuitous pattern about an interior of the cooling plate 830, which may couple with a fluid source through an inlet and outlet channel that extend through the support stem 805. A cooling fluid, such as water or galden, may be circulated through each cooling channel 860 to actively cool the cooling to help dissipate excess heat generated during the plasma formation process, which may reduce or eliminate thermal shift and result in more uniform film deposition on the substrate. The cooling fluid may be circulated at a temperature below or about 100° C., below or about 95° C., below or about 90° C., below or about 85° C., below or about 80° C., below or about 75° C., below or about 70° C., below or about 65° C., below or about 60° C., below or about 55° C., below or about 50° C., or lower.

Figure 9:
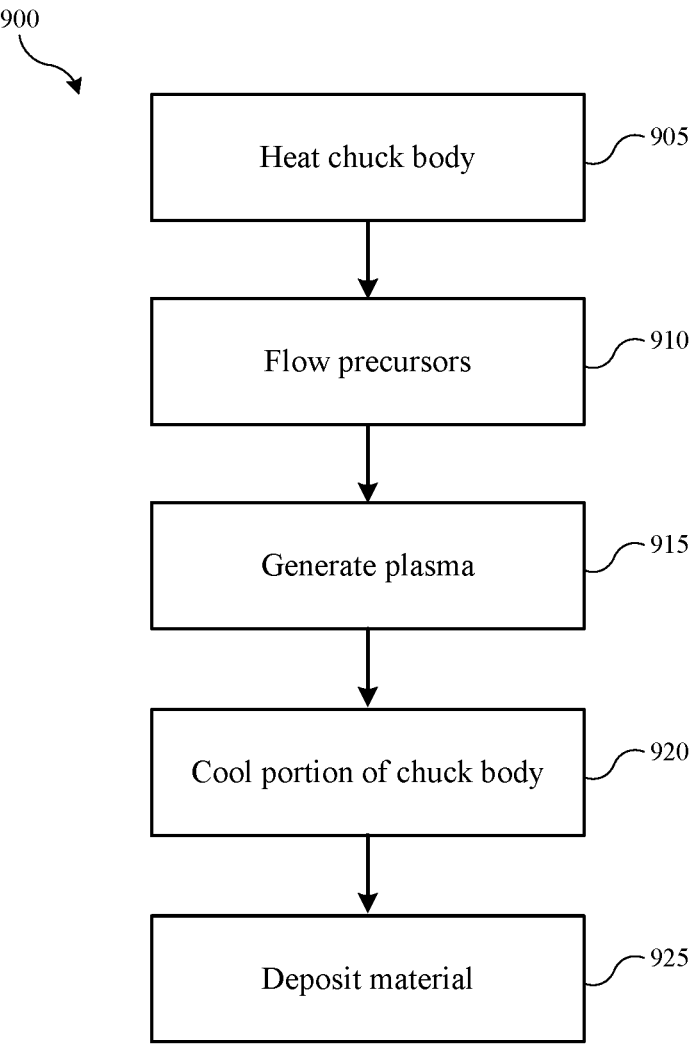
FIG. 9 shows exemplary operations in a processing method according to some embodiments of the present technology.

FIG. 9 shows operations of an exemplary method 900 of semiconductor processing according to some embodiments of the present technology. The method may be performed in a variety of processing chambers, including processing system 200 or chamber 300 described above, which may include substrate support assemblies according to embodiments of the present technology, such as substrate support assembly 310, 400, 500, 600, 700, and/or 800 described herein. Method 900 may include a number of optional operations, which may or may not be specifically associated with some embodiments of methods according to the present technology.

Method 900 may include a processing method that may include operations for forming a hardmask film or other deposition operations. The method may include optional operations prior to initiation of method 900, or the method may include additional operations. For example, method 900 may include operations performed in different orders than illustrated. In some embodiments, method 900 may include heating a top surface of a substrate support assembly at operation 905. For example, an AC current may be supplied to a heating element and/or a dielectric support plate to heat a top portion of an electrostatic chuck body. Although the substrate and/or support may be heated to any temperature previously described, in some embodiments the substrate support may be heated to a temperature above or about 80° C., while being heated to a temperature of less than or about 500° C., less than or about 400° C., less than or about 300° C., or less. In some embodiments, a semiconductor substrate may be clamped to a support surface of a substrate platform using a chucking voltage. One or more precursors may be flowed into a processing chamber at operation 910. For example, the precursor may be flowed into a chamber, such as included in chamber 300. At operation 915, a plasma may be generated of the precursors within the processing region, such as by providing RF power to the faceplate to generate a plasma.

During plasma generation, a bottom portion of the substrate support may be cooled at operation 920. For example, the bottom portion of the substrate support may be cooled to dissipate excess heat generated during the exothermic reaction that forms of the plasma. The cooling of the bottom portion of the substrate support may at least partially overlap the heating of the top portion of the electrostatic chuck body such that the electrostatic chuck body is simultaneously being heated and cooled. In some embodiments, the cooling may be passive cooling using an electrostatic chuck body and/or support stem formed at least partially of materials that have high thermal conductivity. In some embodiments, active cooling may be provided by circulating a cooling fluid through one or more cooling channels formed in the electrostatic chuck body and support stem. Material formed in the plasma may be deposited on the substrate at operation 925. A heating power may be adjusted to accommodate the active cooling and/or heat generation from the plasma generation. By improving the cooling of the substrate support during plasma operations, which may more completely or efficiently counteract a heating effect from the plasma, a processing temperature may be maintained more consistently during the process over any time period. For example, the present technology may allow a temperature or the substrate or substrate support to be maintained during the operation to within +/−5.0° C., and may allow the temperature to be maintained to within +/−4.5° C., within +/−4.0° C., within +/−3.5° C., within +/−3.0° C., within +/−2.5° C., within +/−2.0° C., within +/−1.5° C., within +/−1.0° C., within +/−0.5° C., or less, which may improve process uniformity across the substrate.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the rod" includes reference to one or more rods and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A substrate support assembly, comprising:
an electrostatic chuck body defining a substrate support surface that defines a substrate seat, wherein:
the electrostatic chuck body comprises a conductive material that is operable as a chuck without separate checking electrodes;
the substrate support surface comprises a dielectric coating;
a support stem coupled with the electrostatic chuck body;
a plurality of insulators disposed between the electrostatic chuck body and the support stem, the plurality of insulators comprising an inner insulator and an outer insulator;
a cooling hub positioned below a base of the support stem and coupled with a cooling fluid source, wherein:
the electrostatic chuck body defines at least one cooling channel that is in communication with the cooling fluid source;
a lateral side of the cooling hub defines a cooling fluid inlet and a cooling fluid outlet;
a heater embedded within the electrostatic chuck body;
an AC power rod extending through the support stem and electrically coupled with the heater; and
a plurality of voids formed within the electrostatic chuck body between the at least one cooling channel and the heater, wherein the plurality of voids comprises one or more first voids at a first depth within the electrostatic chuck body and one or more second voids at a second depth within the electrostatic chuck body, wherein the first depth is different than the second depth, wherein the one or more first voids comprises a central void having a circular or elliptical shape and the one or more second voids comprises one or more outer voids having an annular shape.

2. The substrate support assembly of claim 1, further comprising:
an RF rod extending through the support stem and electrically coupled with the electrostatic chuck body.

3. The substrate support assembly of claim 1, wherein:
the dielectric coating covers an entire outer surface of the electrostatic chuck body.

4. The substrate support assembly of claim 1, wherein:
a top end of the support stem comprises a support bowl that is spaced apart from a bottom surface of the electrostatic chuck body; and
at least one insulator is supported atop the support bowl and is disposed between the support bowl and the electrostatic chuck body.

5. The substrate support assembly of claim 4, wherein:
the at least one insulator comprises an inner polymeric insulator and an outer ceramic insulator.

6. The substrate support assembly of claim 4, further comprising:
an insulative edge ring seated on a recessed ledge of the electrostatic chuck body, wherein the insulative edge ring extends radially outward along an exterior edge of the electrostatic chuck body.

7. The substrate support assembly of claim 1, wherein the dielectric coating is provided on an entire top surface of the substrate support surface.

8. The substrate support assembly of claim 1, wherein the cooling hub includes a top surface with the lateral side extending downward from the top surface.

9. The substrate support assembly of claim 1, wherein a top end of the support stem comprises a support bowl that is disposed beneath the inner insulator and the outer insulator.

10. The substrate support assembly of claim 9, wherein the inner insulator is mechanically fastened to the support bowl.

11. The substrate support assembly of claim 10, wherein the outer insulator is floated atop the support bowl without any mechanical coupling.

12. The substrate support assembly of claim 9, wherein a peripheral edge of the support bowl extends laterally outward beyond the substrate seat.

13. The substrate support assembly of claim 1, wherein the inner insulator comprises polyether ether ketone (PEEK).

14. The substrate support assembly of claim 1, wherein the outer insulator comprises aluminum oxide.

15. The substrate support assembly of claim 1, wherein the inner insulator and the outer insulator comprise different materials.

16. The substrate support assembly of claim 1, wherein the dielectric coating is disposed between the plurality of insulators and the electrostatic chuck body.

17. A substrate support assembly, comprising:

an electrostatic chuck body defining a substrate support surface that defines a substrate seat, wherein:

the electrostatic chuck body comprises a conductive material that is operable as a chuck without separate checking electrodes;

the substrate support surface comprises a dielectric coating;

a support stem coupled with the electrostatic chuck body, a top end of the support stem comprises a support bowl that is spaced apart from a bottom surface of the electrostatic chuck body, wherein a top end of the support stem comprises a support bowl that is disposed beneath the inner insulator and the outer insulator;

a plurality of insulators disposed between the electrostatic chuck body and the support stem, the plurality of insulators comprising an inner insulator and an outer insulator;

a cooling hub positioned below a base of the support stem and coupled with a cooling fluid source, wherein:

the electrostatic chuck body defines at least one cooling channel that is in communication with the cooling fluid source;

a lateral side of the cooling hub defines a cooling fluid inlet and a cooling fluid outlet;

a heater embedded within the electrostatic chuck body;

an AC power rod extending through the support stem and electrically coupled with the heater; and a plurality of voids formed within the electrostatic chuck body between the at least one cooling channel and the heater, wherein the plurality of voids comprises one or more first voids at a first depth within the electrostatic chuck body and one or more second voids at a second depth within the electrostatic chuck body, wherein the first depth is different than the second depth.

* * * * *